US012730173B2

(12) United States Patent
Shirai et al.

(10) Patent No.: US 12,730,173 B2
(45) Date of Patent: Sep. 8, 2026

(54) MAGNETIC RESONANCE IMAGING APPARATUS AND IMAGE PROCESSING METHOD

(71) Applicant: FUJIFILM Corporation, Tokyo (JP)

(72) Inventors: Toru Shirai, Tokyo (JP); Tomoki Amemiya, Tokyo (JP); Suguru Yokosawa, Tokyo (JP); Yukio Kaneko, Tokyo (JP); Atsuro Suzuki, Tokyo (JP); Keisuke Nishio, Tokyo (JP); Takenori Murase, Tokyo (JP)

(73) Assignee: FUJIFILM Corporation, Tokyo (JP)

( * ) Notice: Subject to any disclaimer, the term of this patent is extended or adjusted under 35 U.S.C. 154(b) by 146 days.

(21) Appl. No.: 18/906,921

(22) Filed: Oct. 4, 2024

(65) Prior Publication Data

US 2025/0116741 A1 Apr. 10, 2025

(30) Foreign Application Priority Data

Oct. 6, 2023 (JP) ................................ 2023-174410

(51) Int. Cl.

| | |
|---|---|
| ***G01V 3/00*** | (2006.01) |
| ***G01R 33/56*** | (2006.01) |
| ***G01R 33/565*** | (2006.01) |
| ***G06T 12/20*** | (2026.01) |
| ***G06T 12/30*** | (2026.01) |

(52) U.S. Cl.

CPC ... *G01R 33/56545* (2013.01); *G01R 33/5608* (2013.01); *G06T 12/20* (2026.01); *G06T 12/30* (2026.01); *G06T 2211/441* (2023.08)

(58) Field of Classification Search

CPC .......... G01R 33/56545; G01R 33/5608; G06T 12/20; G06T 12/30

USPC ......................................................... 324/309

See application file for complete search history.

(56) References Cited

U.S. PATENT DOCUMENTS 11,125,844 B2 * 9/2021 Shi .................. G01R 33/56536

FOREIGN PATENT DOCUMENTS

JP H09-47440 A 2/1997

OTHER PUBLICATIONS

Qianqian Zhang et al. "MRI Gibbs-Ringing Artifact Reduction by Means of Machine Learning Using Convolutional Neural Networks" Magnetic Resonance in Medicine; 2019; pp. 2133-2145; 82.

* cited by examiner

*Primary Examiner* — Walter L Lindsay, Jr.
*Assistant Examiner* — Frederick Wenderoth
(74) *Attorney, Agent, or Firm* — Studebaker Brackett PLLC

(57) ABSTRACT

Provided is a technology capable of effectively obtaining a ringing correction effect even for a two-dimensional image or a three-dimensional image with a simple CNN configuration.

A CNN that has been trained to perform ringing correction for a direction of a dimension lower than a dimension of an image that is a correction target is prepared, and the CNN is applied in multiple stages to perform the ringing correction. For training the CNN, an image captured by increasing a measurement matrix size in one or two directions need only be used, thereby reducing an imaging time for acquiring training data and a burden of data processing, and enabling handling of images of various dimensions.

14 Claims, 17 Drawing Sheets

FIG. 1

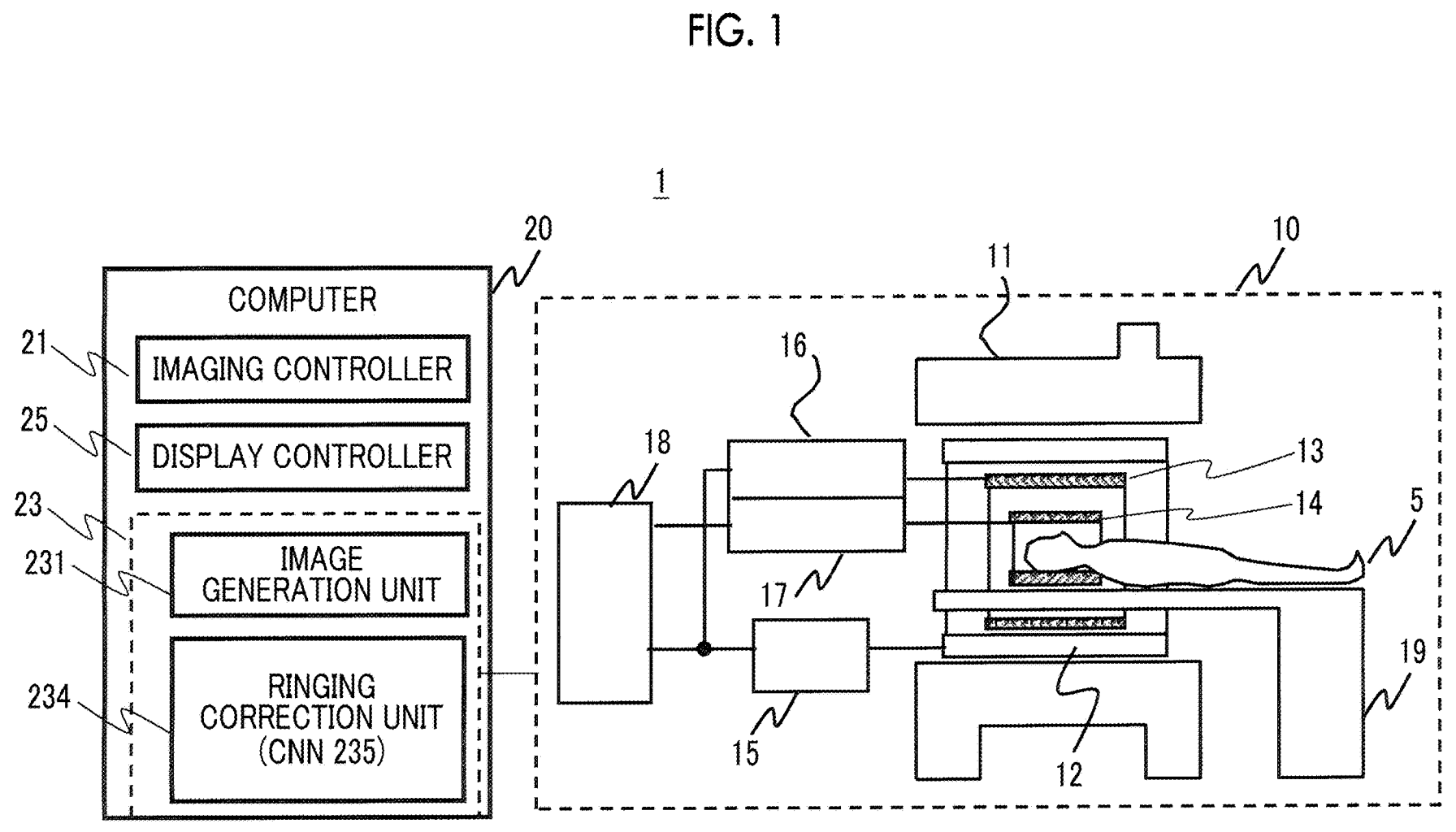

COMPUTER
IMAGING CONTROLLER
DISPLAY CONTROLLER
IMAGE GENERATION UNIT
RINGING CORRECTION UNIT (CNN 235)

1 5 10 11 12 13 14 15 16 17 18 19 20 21 23 25 231 234

501
kx
ky
IFT
511
x
y
502
kx
ky
ZERO-FILL
503
IFT
513
x
y

701
ZERO-FILL IN ONE DIRECTION
702
IFT
703
APPLY CNN
704
FT
705
TRANSPOSITION & ZERO-FILL IN ONE DIRECTION
706
IFT
707
APPLY CNN
708 kz
ky
kx
ZERO-FILL
IN ONE
DIRECTION
kx
IFT
z
y
x
CNN FOR 1D
FT +
ZERO-FILL
IN TWO DIRECTIONS
kz
ky
kx
IFT
CNN FOR 2D
FT
kz
ky
kx
z
y
x

CNN-1 FOR RECTANGULAR SHAPE
(TWO AXIAL EXTRAPOLATION)

CNN-2 FOR RECTANGULAR SHAPE
(ONE AXIAL EXTRAPOLATION)

CNN-3 FOR ELLIPTICAL SHAPE
(TWO AXIAL EXTRAPOLATION)

CNN-4 FOR ELLIPTICAL SHAPE
(ONE AXIAL EXTRAPOLATION)

START
RECEIVE MEASUREMENT DATA
S61
IS SAMPLING PATTERN RECTANGULAR OR ELLIPTICAL?
S62
RECTANGULAR
ELLIPTICAL
SELECT CNN-1 AND CNN-2
S68
2D OR 3D?
S61
2D
3D
PROCESSING OF EMBODIMENT 1 (FIG. 6)
S69
PROCESSING OF MODIFICATION OR EMBODIMENT 2 (FIGS. 8, 9, AND 11)
S70
2D OR 3D?
S63
2D
3D
SELECT CNN-4
S64
PROCESSING OF EMBODIMENT 1 (FIG. 6)
S65
SELECT CNN-2 + (CNN-3 OR CNN-4)
S66
PROCESSING OF MODIFICATION OR EMBODIMENT 2 (FIGS. 8, 9, AND 11)
S67
END

MAGNETIC RESONANCE IMAGING APPARATUS AND IMAGE PROCESSING METHOD

CROSS-REFERENCE TO RELATED APPLICATIONS

The present application claims priority under 35 U.S.C. § 119 to Japanese Patent Application No. 2023-174410, filed Oct. 6, 2023. Each of the above application(s) is hereby expressly incorporated by reference, in its entirety, into the present application.

BACKGROUND OF THE INVENTION

1. Field of the Invention

The present invention relates to a magnetic resonance imaging apparatus, and more particularly, to a ringing correction technology of an image acquired by the magnetic resonance imaging apparatus.

2. Description of the Related Art

A magnetic resonance imaging (MRI) apparatus applies phase encoding to a nuclear magnetic resonance signal (echo signal) generated by a subject using a gradient magnetic field and collects the echo signals with different frequencies within a sampling time by using the gradient magnetic field in a direction orthogonal to a phase encoding direction in a case in which the nuclear magnetic resonance signal is sampled. Data consisting of a large number of echo signals having different types of phase encoding is measurement data having a matrix size determined by the number of types of phase encoding and the number of samplings, that is, k-space data. The MRI apparatus reconstructs an image of the subject by performing processing such as a Fourier transform on the k-space data.

The matrix size during measurement (measurement matrix size) varies depending on imaging conditions such as restrictions of the apparatus and an imaging time. On the other hand, the matrix size of the image to be reconstructed (reconstruction matrix size) may be the same as the measurement matrix size, but in order to obtain an image with a desired resolution, the image is often reconstructed with a matrix size different from the measurement matrix size.

Since the measurement matrix size is discrete and finite in a frequency space, in a case in which the measurement matrix size and the reconstruction matrix size are different from each other, a periodic or streak artifact called a Gibbs ringing or a truncation artifact (hereinafter referred to as ringing) is more strongly generated in the reconstructed image. The ringing artifact can be suppressed, for example, by applying a k-space filter that smooths a high-frequency region to the measurement data, but there is a disadvantage that the sharpness of the image is decreased and the image is blurred by the application of the k-space filter. In addition, as a ringing correction technology, a method of performing extrapolation processing such as non-harmonic expansion processing on measurement data has also been proposed (JP2017-047440A (JP-H09-047440A) and the like). In this processing, there is a disadvantage that the calculation load is high and the processing time is long because fitting processing of a non-harmonic function is performed for each dimension in the measurement space.

Meanwhile, a technology of using the CNN to correct the ringing in real space has also been proposed. For example, Qianqian Zhang et al. Magn Reson Med. 2019; 82:2133-2145 proposes using a deep learning model, such as a CNN, which has been trained by using images reconstructed by combining various measurement matrix sizes and reconstruction matrix sizes.

SUMMARY OF THE INVENTION

The images obtained by the MRI include a two-dimensional image and a three-dimensional image, and in order to apply the technology disclosed in Qianqian Zhang et al. Magn Reson Med. 2019; 82:2133-2145 to the image of each dimension, combinations of various images are required as training data for the CNN, making the construction of the CNN difficult. In the CNN, it is necessary to use a high-resolution image as a training image, but in a case in which the measurement matrix size of the phase encoding is increased, it takes a long time to perform the imaging. In order to obtain a sufficient SNR image, it is necessary to increase the integrating accumulation, which takes a longer time. In addition, in abdominal imaging or the like, breath-holding imaging is required to reduce a body movement artifact caused by respiration, but it is difficult to acquire a high-resolution three-dimensional image during breath-holding imaging.

An object of the present invention is to provide a technology capable of effectively obtaining a ringing correction effect even for a two-dimensional image or a three-dimensional image with a simple CNN configuration.

In order to achieve the above-described object, in the present invention, a CNN that has been trained to perform ringing correction for a lower-dimensional direction than an image that is a correction target is prepared, and the CNN is applied in multiple stages to perform the ringing correction. As a result, a burden of training the CNN is reduced, and a ringing correction effect is obtained with a low burden even for various images, including a two-dimensional image and a three-dimensional image.

That is, an aspect of the present invention provides an MRI apparatus comprising: an imaging unit that collects measurement data consisting of magnetic resonance signals; an image generation unit that has a function of reconstructing the measurement data at a reconstruction matrix size different from a matrix size of the measurement data; and a ringing correction unit that corrects ringing of a reconstructed image. The image generation unit includes a matrix size change unit that changes the matrix size by performing zero-filling of a high-frequency region in a one-dimensional direction or a two-dimensional direction on the measurement data. The ringing correction unit includes a CNN that has been trained to obtain a ringing correction effect for a direction of a dimension lower than a dimension of the reconstructed image generated by the image generation unit, and applies, in a real space, the CNN in multiple stages to the measurement data after the zero-filling to perform ringing correction.

Another aspect of the present invention provides an image processing method of correcting a ringing artifact of a reconstructed image acquired by an MRI apparatus.

The image processing method comprises a first size change step of performing zero-filling processing of a high-frequency region in a one-dimensional or two-dimensional direction on measurement data of the reconstructed image to generate second measurement data having a larger matrix size than the measurement data; a first correction step of using a CNN that has been trained to obtain a ringing correction effect for a direction of a dimension lower than a dimension of the reconstructed image to perform, in a real space, ringing correction on the second measurement data for a direction in which the zero-filling processing is performed; a second size change step of performing zero-filling of a high-frequency region in a direction orthogonal to the direction of the zero-filling processing in the first size change step on the second measurement data corrected in the first correction step to generate third measurement data having a larger matrix size than the second measurement data; and a second correction step of using the CNN to perform, in the real space, ringing correction on the third measurement data for the direction orthogonal to the direction in which the zero-filling processing in the first size change step.

It should be noted that the ringing correction in the real space corresponds to extrapolation processing of a region (high-frequency region) subjected to zero-filling in the k-space.

According to the aspect of the present invention, in the ringing correction using the CNN, it is not necessary to capture and prepare a large number of high-resolution images of various types for training the CNN, the CNN can be easily constructed, and a high ringing correction effect can be obtained for both the two-dimensional image and the three-dimensional image by using the CNN in multiple stages.

BRIEF DESCRIPTION OF THE DRAWINGS

FIG. 1 is a diagram showing an overall configuration of an MRI apparatus to which the present invention is applied.

DESCRIPTION OF THE PREFERRED EMBODIMENTS

Figure 2:
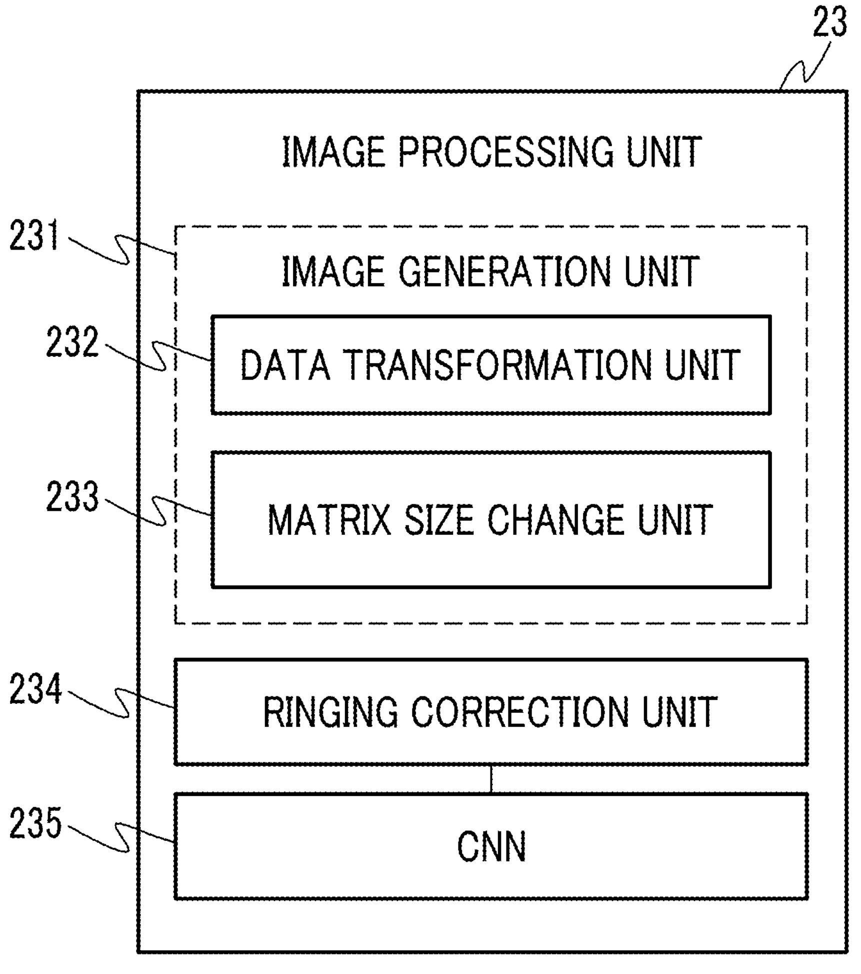
FIG. 2 is a functional block diagram of an image processing unit.

Hereinafter, embodiments of an MRI apparatus and an image processing method realized by the MRI apparatus according to an embodiment of the present invention will be described with reference to the accompanying drawings.

First, an outline of a configuration of an MRI apparatus 1 to which the present invention is applied will be described. The present invention can be applied to most types of MRI apparatuses that are currently in widespread use, and the configuration thereof roughly includes an imaging unit 10 that collects nuclear magnetic resonance signals, a computer 20 that controls the imaging unit and performs various types of operations, and various devices that are associated with the imaging unit 10 and the computer 20, such as an input device, a display device, and an external storage device, as shown in FIG. 1.

Since the configuration of the imaging unit 10 is the same as a configuration of a normal MRI apparatus, a detailed description thereof will be omitted, but the imaging unit 10 comprises a static magnetic field magnet 11 that generates a static magnetic field space in which a subject 5 is placed, a gradient magnetic field coil 12 that applies a gradient magnetic field in a static magnetic field, an RF transmission coil 13, an RF receive coil 14, a gradient magnetic field power supply 15 that drives these coils and a transmitter 16, a receiver 17 to which a high-frequency receive coil is connected, and a bed device 19 that transports the subject 5 into the static magnetic field space. Further, the imaging unit comprises a sequencer 18 that controls the operations of sampling the signals via the gradient magnetic field coil 12, the RF transmission coil 13, and the RF receive coil 14 in accordance with a pulse sequence.

The computer 20 includes an imaging controller 21 that controls the operation of the imaging unit 10 via the sequencer 18, an image processing unit 23 that performs image reconstruction and other processing on measurement data (k-space data) collected by the imaging unit 10, and a display controller 25 that controls the display of the reconstructed images, a GUI, and the like.

The computer 20 can be configured as a general-purpose computer comprising a CPU or a GPU and a memory, and the above-described functions of the computer are programmed in advance and realized by uploading the program to the CPU or the like. In addition, some functions of the computer may be realized by hardware such as an ASIC or a programmable IC, and the computer according to the embodiment of the present invention includes these hardware components.

The image processing unit 23 according to the present embodiment includes an image generation unit 231 and a ringing correction unit 234, and the ringing correction unit 234 comprises a specific CNN 235 that has been trained for ringing correction.

The image generation unit 231 is a functional unit that performs operations such as an inverse Fourier transform using measurement data collected by the imaging unit 10, that is, k-space data, to reconstruct an image, and comprises, as shown in FIG. 2, a data transformation unit 232 that transforms the measurement data (k-space data) into real space data (image data), and a matrix size change unit 233 that changes a matrix size of the k-space data.

In a case of reconstructing the image, it is generally performed to change (expand) a measurement matrix size of the measurement data in order to increase the apparent resolution, but the matrix size change unit 233 according to the present embodiment performs the size change in a predetermined dimension direction depending on a CNN to be applied during the ringing correction, in addition to the general size change. Details of the processing performed by the matrix size change unit 233 will be described in the following embodiment.

The ringing correction unit 234 comprises a CNN 235 that has been trained to obtain a ringing correction effect for the ringing in a direction of a dimension lower than a dimension (number of axes) of the image that is a ringing correction target. For example, in a case in which the image that is the correction target is a three-dimensional image, the CNN 235 is a CNN that has been trained to obtain a ringing correction effect for a two-dimensional direction or a one-dimensional direction. The CNN can be trained, for example, by using, as training data, an image (correct answer image) reconstructed from the measurement data acquired at a measurement matrix size that is the same as the reconstruction matrix size and an image reconstructed by using measurement data acquired at a measurement matrix size smaller than the reconstruction matrix size for at least one direction. Since the correct answer image need only be captured with a measurement matrix size that is increased only for a direction of a lower dimension than the image that is the correction target, the imaging time for acquiring the correct answer image can be significantly shortened.

The ringing correction unit 234 may comprise two types of CNNs, that is, a CNN for two-dimensional direction ringing correction and a CNN for one-dimensional direction ringing correction. The computer 20 has a form in which such a CNN is available, for example, has a specific built-in CNN or is connectable to a specific CNN.

Figure 3:
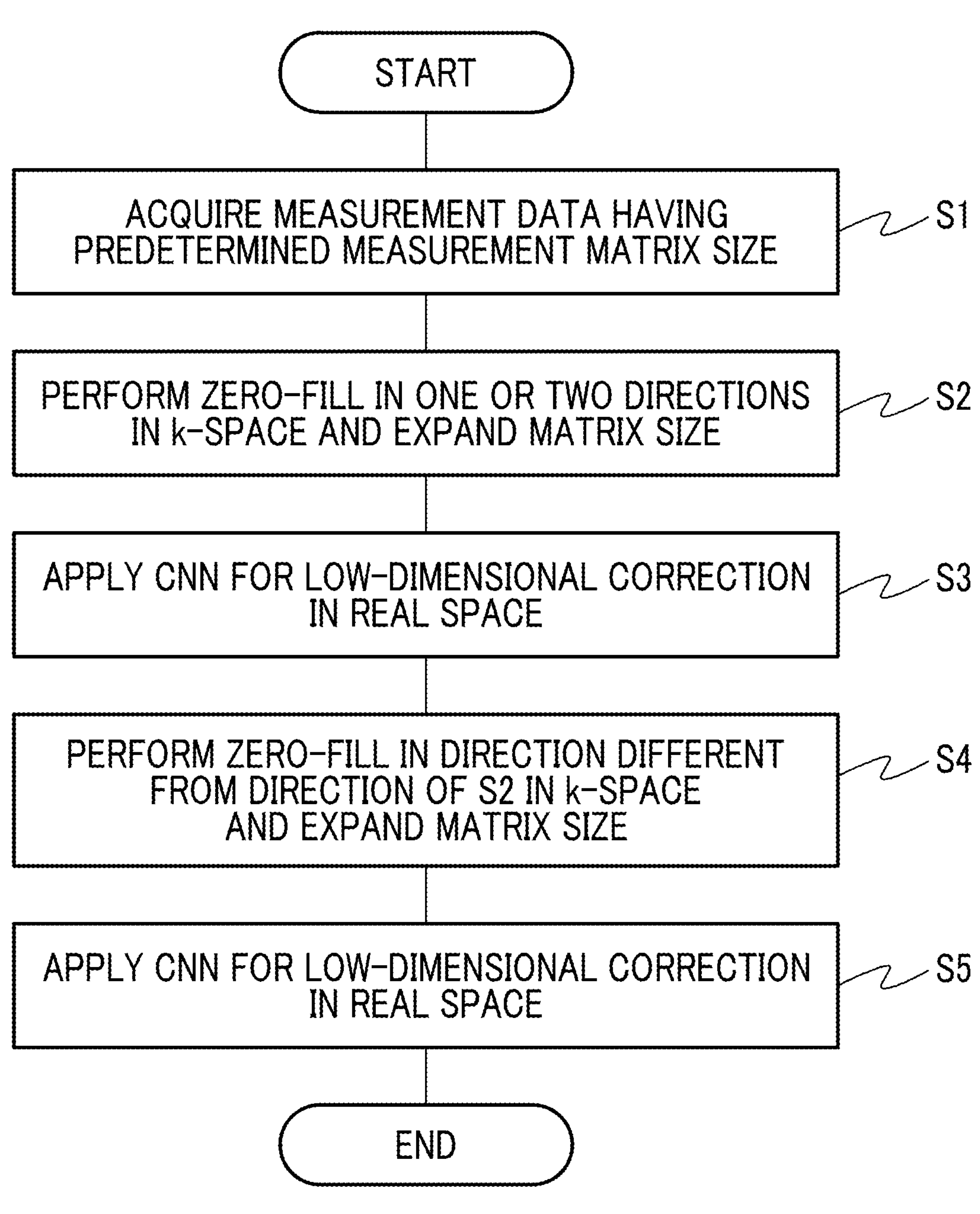
FIG. 3 is a diagram showing an outline of an image processing procedure.

Next, an outline of the imaging and the ringing correction procedure in the MRI apparatus having the above-described configuration will be described with reference to FIG. 3.

First, the imaging unit 10 images the imaging part of the subject at the measurement matrix size determined by the pulse sequence, and acquires the measurement data (S1). The image generation unit 231 reconstructs the image at the predetermined reconstruction matrix size using the acquired measurement data, but performs the extrapolation of the high-frequency region of the measurement data in accordance with the reconstruction matrix size prior to the reconstruction.

Therefore, first, the matrix size change unit 233 changes the matrix size of the measurement data (S2). The change of the matrix size is performed for a direction of a dimension lower than the dimension of the measurement data. For example, in a case of three-dimensional (axial) measurement data, the size is changed in a one-dimensional direction or a two-dimensional direction. In a case of two-dimensional measurement data, the size change in the one-dimensional direction. The size change is performed by expanding the high-frequency region of the dimension to be changed in size through zero-filling.

The measurement data after the size change is subjected to the ringing correction using the CNN in the dimension (direction) that is changed in size in the real space (S3). That is, the measurement data after the size change is subjected to an inverse Fourier transform to obtain image data, and the CNN 235 for low-dimensional correction is applied. As a result, the ringing that has occurred in the dimension that is changed in size is corrected.

Next, in S3, the ringing-corrected image is subjected to a Fourier transform to restore the image to the k-space data. The k-space data after the ringing correction is data obtained by extrapolating the data in the high-frequency region expanded by zero-filling through the application of the CNN. The k-space data is changed in the measurement matrix size for a direction of a dimension different from the dimension changed in size in S3 (S4). In this case, the size change is performed in the same manner as in S2, and the high-frequency region in the direction of the size change is expanded by zero-filling.

Then, in the same manner as S3, the ringing correction in the dimension (direction) after the size change is performed on the measurement data after the size change, in the real space (S5). However, in a case in which the CNN 235 used in S3 is a CNN for the one-dimensional direction ringing correction and the CNN 235 used in present step S5 is also the same CNN for the one-dimensional direction ringing correction, the processing of transposing the image after an inverse Fourier transform is performed before the application of the CNN 235, and the same CNN 235 is applied to correct the ringing in a direction different from the direction in S3.

Steps S4 and S5 are repeated as needed in accordance with the dimension of the image, and finally a ringing-corrected image is obtained. The measurement data obtained by performing a Fourier transform on the image is measurement data in which a region expanded through the zero-filling for the entire measurement data is extrapolated, and the occurrence of ringing is suppressed in the image reconstructed from this measurement data.

According to the present embodiment, by using a CNN that has been trained to obtain a correction effect on the ringing that has occurred in the direction of the dimension lower than the dimension of the image that is the ringing correction target in multiple stages, it is not necessary to capture a large number of high-dimensional image data as the training data, the training step of the CNN can be easily performed, and a ringing correction effect equivalent to using high-dimensional image data can be obtained.

Hereinafter, specific embodiments in which the image dimensions and the application methods of the CNN are different will be described. In the following embodiments, the configurations of the MRI apparatus and the image processing unit are common to the configurations shown in FIGS. 1 and 2, and thus FIGS. 1 and 2 may be referred to as needed.

Embodiment 1

In the MRI apparatus according to the present embodiment, the ringing correction unit 234 comprises a CNN that has been trained to obtain a ringing correction effect for the one-dimensional direction. As an example, a case will be described in which the image that is the ringing correction target is a two-dimensional image.

First, a specific configuration and a training step of the CNN 235 used for the ringing correction will be described.

In general, the CNN has a structure in which a plurality of convolution layers and pooling layers are stacked between an input layer and an output layer, and coefficients or weights of the layers are changed through training, so that a desired output is obtained. In the present embodiment, such a general CNN can also be adopted, but a complex-valued CNN is adopted because a complex image can be obtained in the MRI. By using the CNN corresponding to the complex image, the processing can be performed without being affected by an intensity or a phase of the signal.

Figure 4:
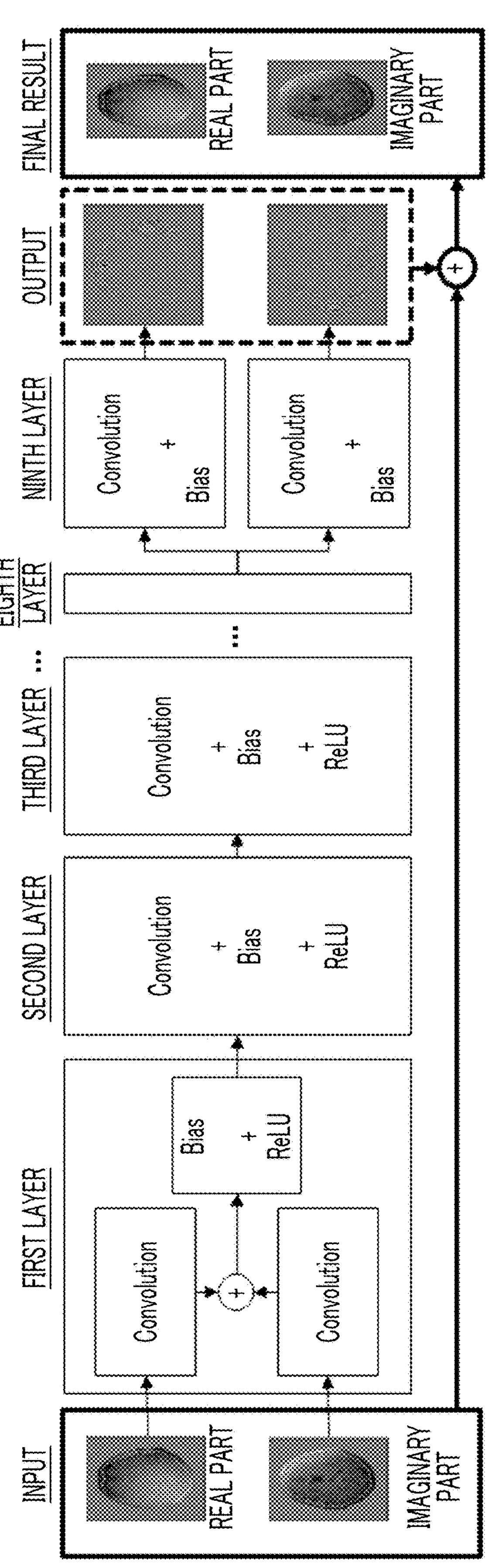
FIG. 4 is a diagram showing an example of a structure of a CNN adopted in Embodiment 1.

FIG. 4 shows an example of the complex-valued CNN adopted in the present embodiment.

The CNN 235 is a complex-valued CNN having a nine-layer structure in which each layer is formed by a block consisting of a convolution layer, an activation function (ReLU), and a pooling layer, the real part and the imaginary part of the input image are combined in the first layer, and the real part and the imaginary part are separated in the ninth layer. It should be noted that a kernel size or the number of channels of each layer is not particularly limited, but for example, the kernel size can be "3×3" to "9×9", and the number of channels can be "16 ch" to "128 ch". Although a simple CNN is shown as an example in the present embodiment, the CNN is not limited to this. For example, a resolution-changed CNN, such as U-net, may be used.

Figure 5:
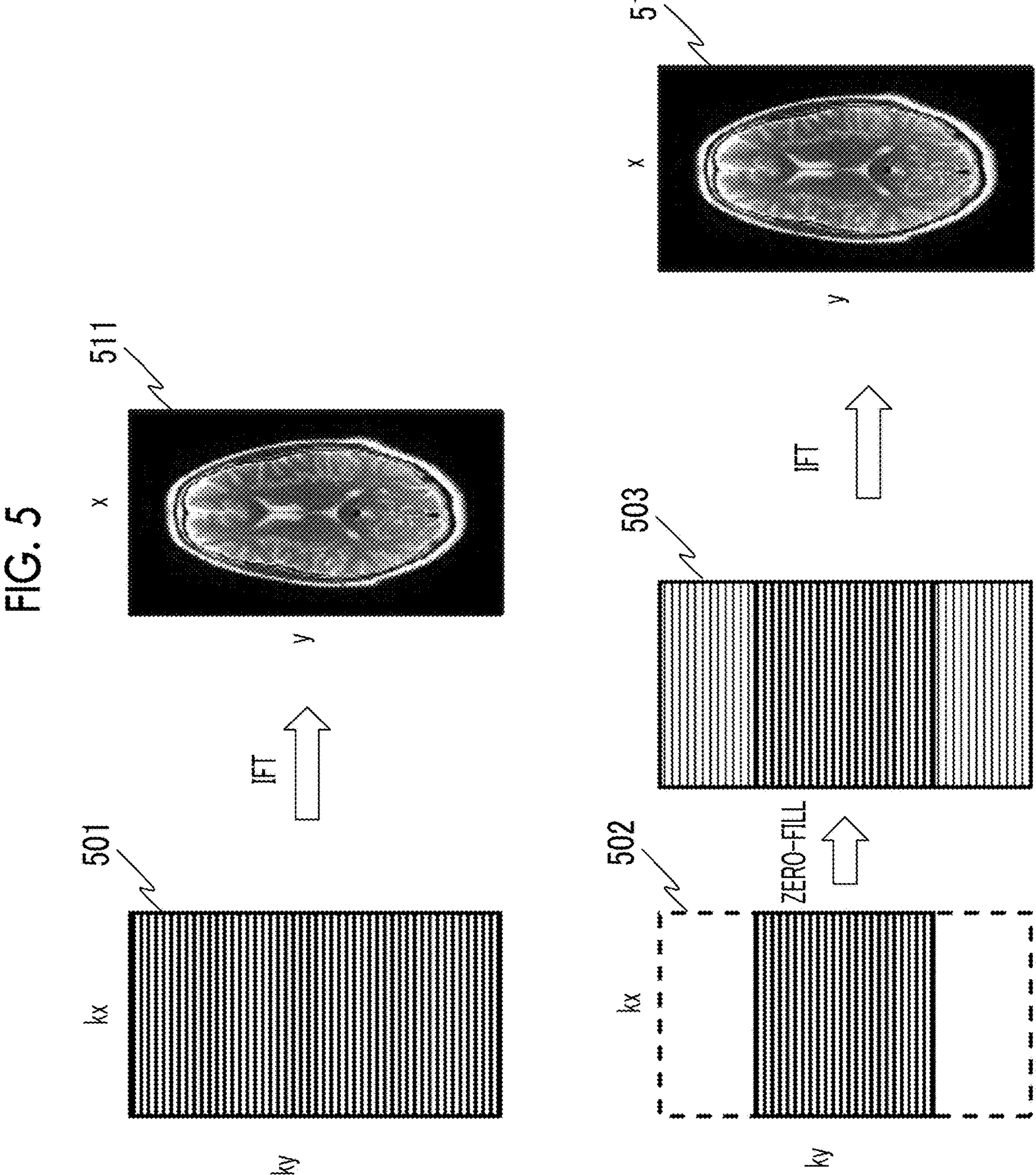
FIG. 5 is a diagram showing a training image set for the CNN.

In the training step of the CNN, an image set including a plurality of correct answer images (complex number) and a plurality of input images (complex number) is prepared as training data. The training data differs depending on whether the CNN is used for the one-dimensional direction ringing correction or the two-dimensional direction ringing correction. In a case of the CNN for the one-dimensional direction ringing correction, the correct answer image (first image) is, as shown in FIG. 5, an image 512 obtained by performing an inverse Fourier transform on the measurement data 501 obtained by the imaging at the measurement matrix size in which the matrix size in at least one direction (for example, ky direction) is larger than the matrix size in the other direction (for example, kx direction), which is a high-resolution image (2D image) in which almost no ringing has occurred. The image 512 is an image stretched in the y direction.

The input image (second image) is an image 513 obtained by changing a size of the measurement data 502, which is obtained by imaging the same imaging target in the ky direction and the kz direction at the same matrix size, through zero-filling of only the high-frequency region in the ky direction to obtain measurement data 503 having the same matrix size as the measurement data of the first image, and then performing an inverse Fourier transform (IFT). The image 513 is also an image stretched in the y direction as in the correct answer image 511, but the ringing that is not included in the correct answer image 511 has occurred in the y direction.

In a case of the CNN for the two-dimensional direction ringing correction, an image obtained by performing an inverse Fourier transform on the measurement data captured at the measurement matrix size that is the same as the final reconstruction matrix size is used as the correct answer image, and an image obtained by being captured at the measurement matrix size smaller than the reconstruction matrix size in both the kx direction and the ky direction, performing zero-filling of the high-frequency regions in both directions, and then reconstructing the image is used as the input image.

By preparing a large number of such combinations of the correct answer image 511 and the input image 513 and performing training using the combinations of the correct answer image 511 and the input image 513 as the training data, the trained CNN can output an image close to the correct answer image, that is, the ringing-corrected image, with respect to the input image.

It should be noted that, for the same imaging target, a first image obtained by being captured by increasing the measurement matrix size in at least one direction and a second image obtained by being captured by increasing the measurement matrix size in a direction different from the direction of the first image may be prepared and used as the training data, the first image and the second image being rotated such that the directions of the increased measurement matrices match each other.

By using such training data, it is possible to further simplify the preparation of the training data and the training step using the training data.

Next, a flow of the correction via the ringing correction unit 234 having such a configuration will be described with reference to FIGS. 6 and 7. In this example, the ringing correction target is a two-dimensional image, and the CNN 235 is a CNN that has been trained to obtain a ringing correction effect for the one-dimensional direction.

The matrix size change unit 233 performs zero-filling of the high-frequency region in a frequency encoding or phase encoding direction on the measurement data 701 acquired at the predetermined measurement matrix size, to obtain the k-space data 702 expanded in size (S21). In the example of FIG. 6, the matrix is doubled in the frequency encoding direction.

The data transformation unit 232 performs an inverse Fourier transform (IFT) on the k-space data 702 after the size change to obtain the real space data, that is, an image 703, and then applies the CNN 235 for one-dimensional correction to perform the ringing correction (S22). As a result, the ringing that has occurred in the frequency encoding direction (vertical direction in FIG. 7) in the image 703 is corrected. A ringing-corrected image 704 is subjected to a Fourier transform to be restored to the k-space data 705, the image is transposed to interchange the frequency encoding direction (x direction) and the phase encoding direction (y direction), and the matrix size is expanded by performing zero-filling of the high-frequency region in the phase encoding direction (S23). The k-space data 706 after the expansion is subjected to an inverse Fourier transform to obtain the real space data, that is, an image 707 (S24), and then the same CNN 235 for the one-dimensional correction as in S22 is applied to perform the ringing correction (S25). As a result, the ringing that has occurred in the vertical direction of FIG. 7, that is, in the phase encoding direction, is corrected. Finally, a ringing-corrected image 708 is rotated in the reverse direction of S24 to return to the original position (S26). The image after the transposition is subjected to a Fourier transform to obtain measurement data 709 in which the high-frequency region is extrapolated.

Figure 6:
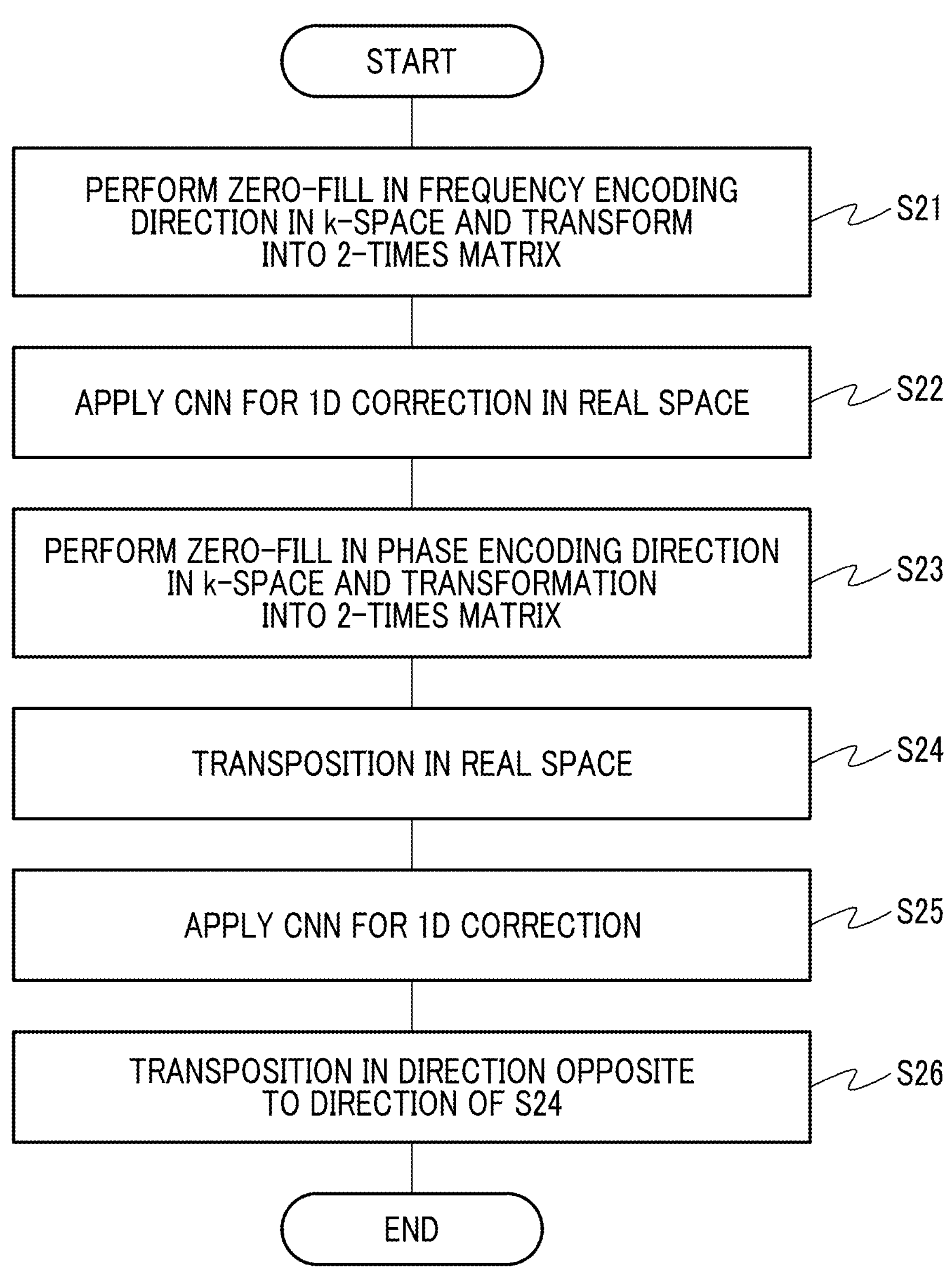
FIG. 6 is a diagram showing a flow of image processing in Embodiment 1.
Figure 7:
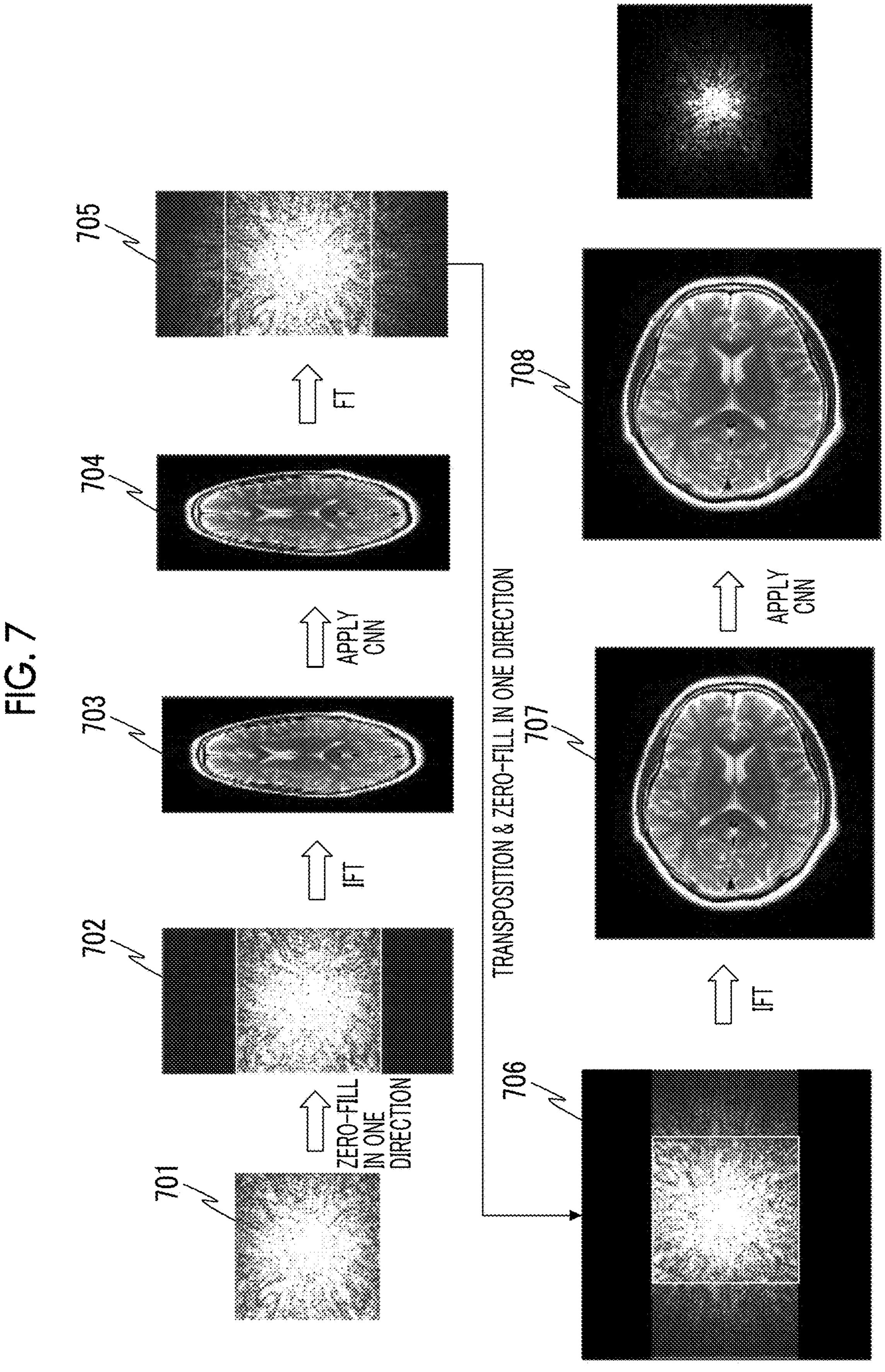
FIG. 7 is a diagram showing ringing correction processing of Embodiment 1.

It should be noted that, in FIG. 6, as an example, the size in the frequency encoding direction is changed, and then the size in the phase encoding direction is changed, but the same effect can be obtained regardless of which change is performed first. In addition, in the above-described embodiment, a case is described in which the ringing correction is performed by using a single CNN, but in a case in which the ratio between the measurement matrix size and the matrix size after the size change is different between the frequency encoding direction and the phase encoding direction, it is also possible to prepare a plurality of CNNs having different matrix ratios as the CNN and to apply the CNN having the closest matrix ratio. As a result, a more accurate ringing correction effect can be obtained for each direction.

As described above, according to the present embodiment, the ringing correction can be performed for each two-dimensional direction by applying a single CNN trained for the one-dimensional direction correction to the two-dimensional image, which is the correction target. In addition, since one CNN for the one-dimensional direction correction need only be prepared as the CNN 235, the CNN can be easily constructed, and the burden of processing in a case of applying the CNN can be reduced.

Modification Example of Embodiment 1

Although the correction target is a two-dimensional image in Embodiment 1, even in a case of a three-dimensional image, the ringing correction in the three-dimensional direction can be performed similarly by applying the CNN for the one-dimensional direction correction in multiple stages.

Figure 8:
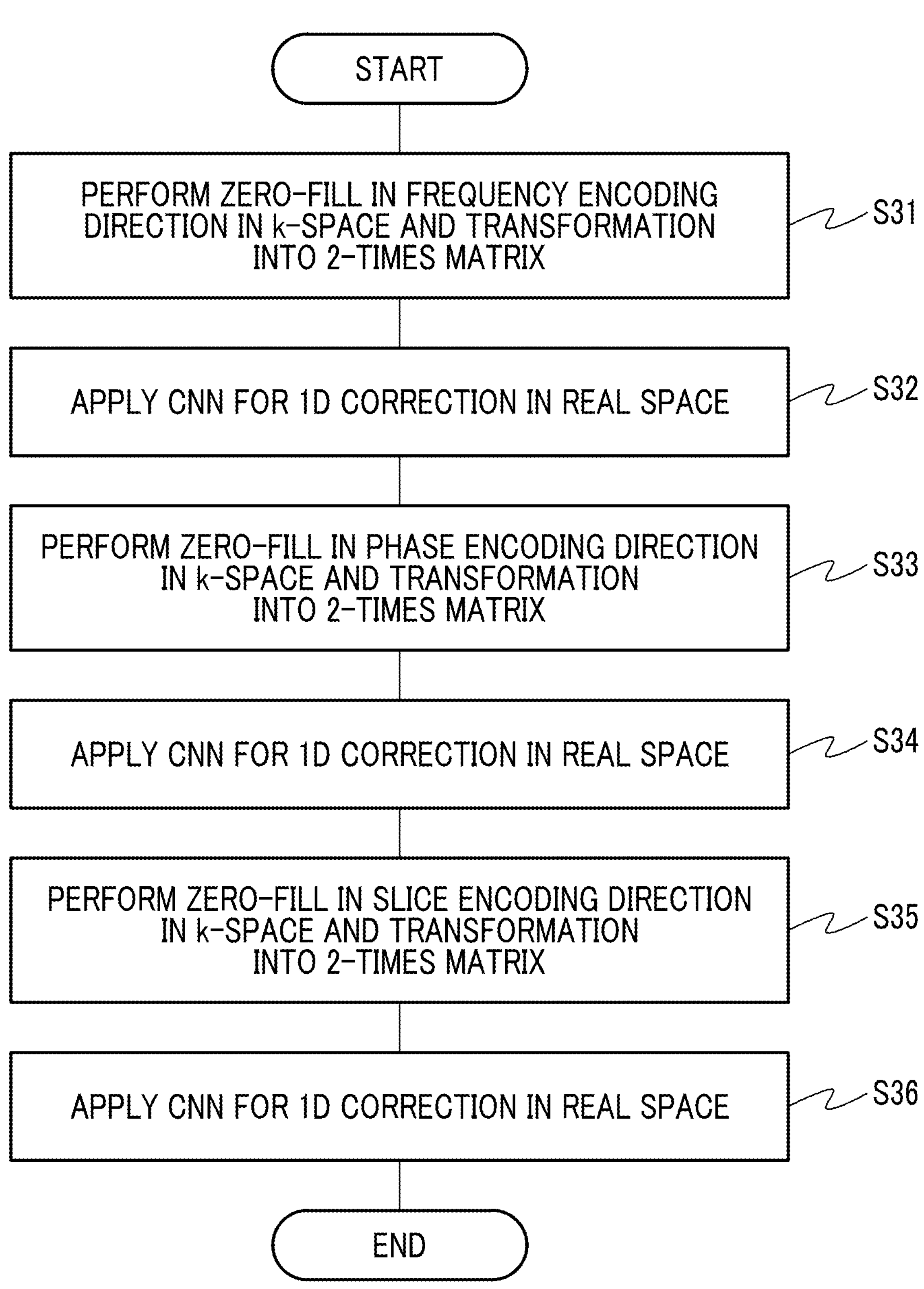
FIG. 8 is a diagram showing a flow of image processing in a modification example of Embodiment 1.

FIG. 8 shows a flow of processing of the present modification example. Here, as an example, a case will be described in which the ringing correction of the image reconstructed by doubling the measurement matrix size for each three-dimensional direction is performed.

First, one direction of the three-dimensional direction of the measurement data, in the example of FIG. 8, a slice encoding direction, is subjected to zero-filling in the k-space to expand the high-frequency region, and transformation is performed into a matrix in which a size in the slice encoding direction is doubled (S31). Next, the expanded k-space data is subjected to an inverse Fourier transform, and the ringing correction in the expanded direction is performed by applying the CNN 235 for the one-dimensional correction in the real space (S32). The ringing-corrected image is subjected to a Fourier transform and restored to the k-space data, the phase encoding direction is subjected to zero-filling in the k-space to expand the high-frequency region, and transformation is performed into a matrix in which the size in the phase encoding direction is also doubled (S33).

The k-space data is subjected to an inverse Fourier transform to obtain the real space data, the real space data is transposed such that the direction to be corrected by the CNN 235 and the size change direction (phase encoding direction) match each other, and then the CNN 235 is applied to perform the ringing correction (S34).

The same processing is performed for the frequency encoding direction. That is, the ringing-corrected image is subjected to a Fourier transform and restored to the k-space data, the frequency encoding direction is subjected to zero-filling in the k-space to expand the high-frequency region, and the size in the frequency encoding direction is also changed to be doubled (S35). Next, the real space data is transformed, and the CNN 235 after transposition is applied to perform the ringing correction (S35).

In the present modification example as well, as in Embodiment 1, the correction processing may be performed from any direction in the three-dimensional direction. In addition, a plurality of CNNs for the one-dimensional direction correction having different matrix ratios may be prepared, and an appropriate CNN may be applied in accordance with the change in size (matrix ratio) in each direction. Further, even in a case of a three-dimensional image, the same processing as in Embodiment 1 need only be performed in a case in which the measurement matrix size is not changed for one dimension direction.

According to the present modification example, it is possible to effectively correct the ringing that has occurred in the three-dimensional direction by preparing a single type of CNN for the one-dimensional correction even in a case of a three-dimensional image.

Embodiment 2

Although only the CNN for the one-dimensional direction ringing correction is used in Embodiment 1, in the present embodiment, the ringing correction is performed by using two types of CNN, that is, the CNN for the one-dimensional direction ringing correction and the CNN for the two-dimensional direction ringing correction, with the three-dimensional image as a target. The apparatus configuration according to the present embodiment is the same as the apparatus configuration according to Embodiment 1, except that there are two types of CNNs.

Hereinafter, a flow of processing according to the present embodiment will be described with reference to FIGS. 9 and 10.

Figure 9:
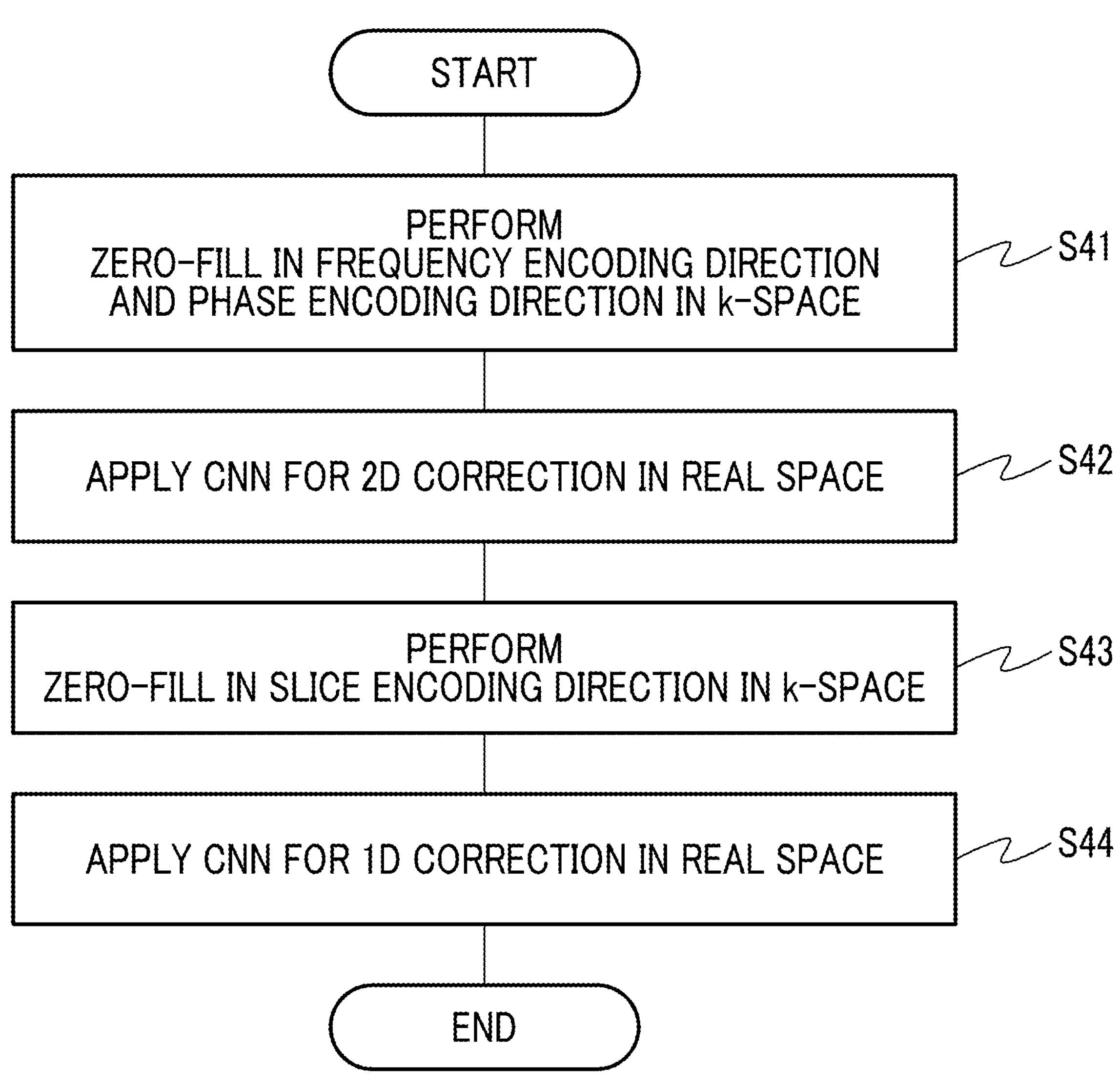
FIG. 9 is a diagram showing an example of image processing in Embodiment 2.

First, two directions of the three-dimensional direction of the measurement data, in the example of FIG. 9, the frequency encoding direction and the phase encoding direction, are subjected to zero-filling in the k-space to expand the high-frequency region, and transformation is performed into a matrix in which sizes in the two directions are doubled (S41). Next, the expanded k-space data is subjected to an inverse Fourier transform, and the ringing correction in the expanded direction is performed by applying the CNN 235 for the two-dimensional correction in the real space (S42). The ringing-corrected image is subjected to a Fourier transform and restored to the k-space data, the slice encoding direction is subjected to zero-filling in the k-space to expand the high-frequency region, and transformation is performed into a matrix in which the size in the slice encoding direction is also doubled (S43).

The k-space data is subjected to an inverse Fourier transform to obtain the real space data, the real space data is transposed such that the direction to be corrected by the CNN 235 and the size change direction (slice encoding direction) match each other, and then the CNN 235 for the one-direction ringing correction is applied to perform the ringing correction (S44).

As a result, the ringing that has occurred in each three-dimensional direction of the three-dimensional image can be corrected, and the k-space data obtained by performing a Fourier transform on the image obtained in S44 is the measurement data in which the high-frequency region is extrapolated.

Figure 10:
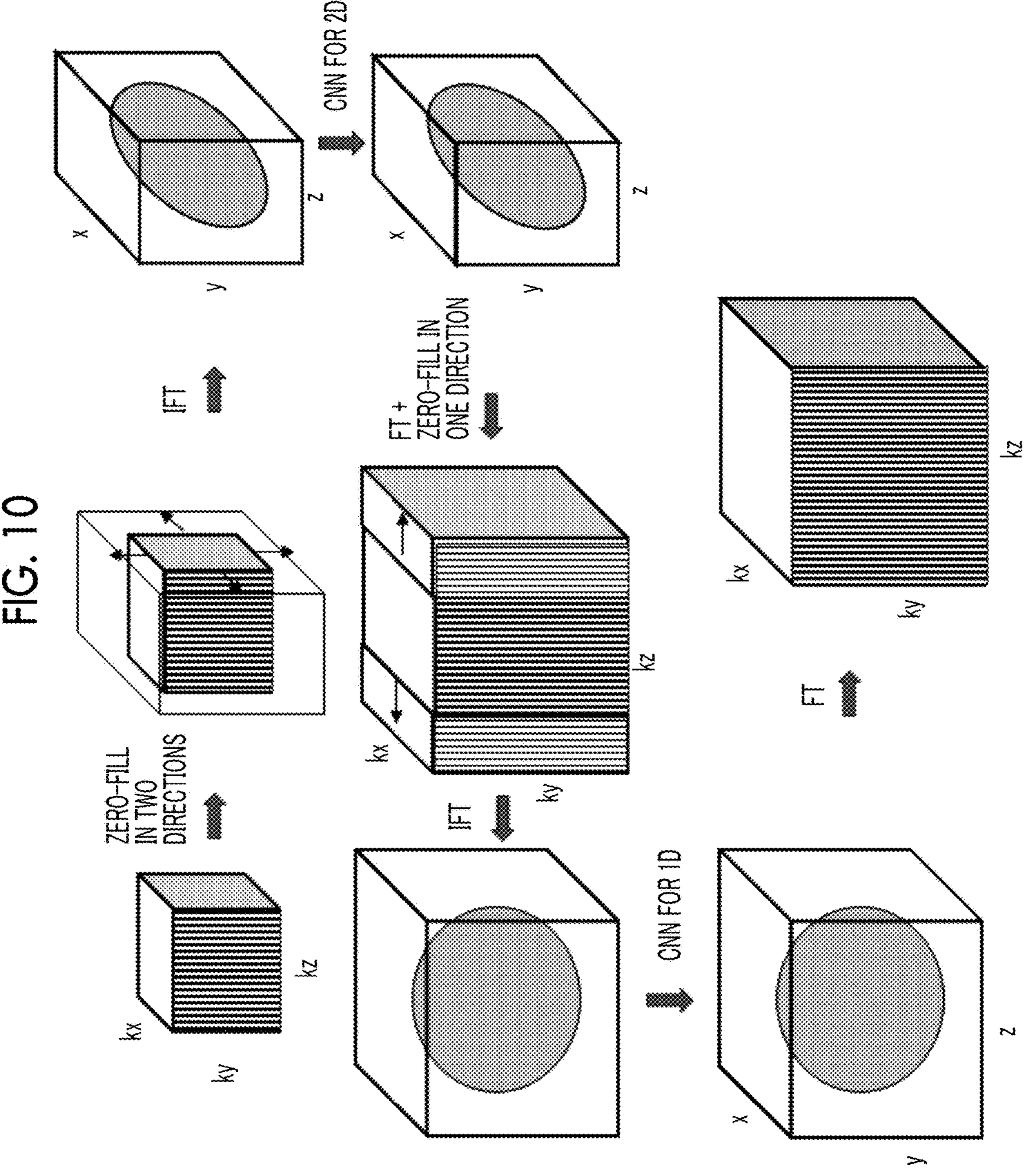
FIG. 10 is a diagram showing the processing of FIG. 9.
Figure 11:
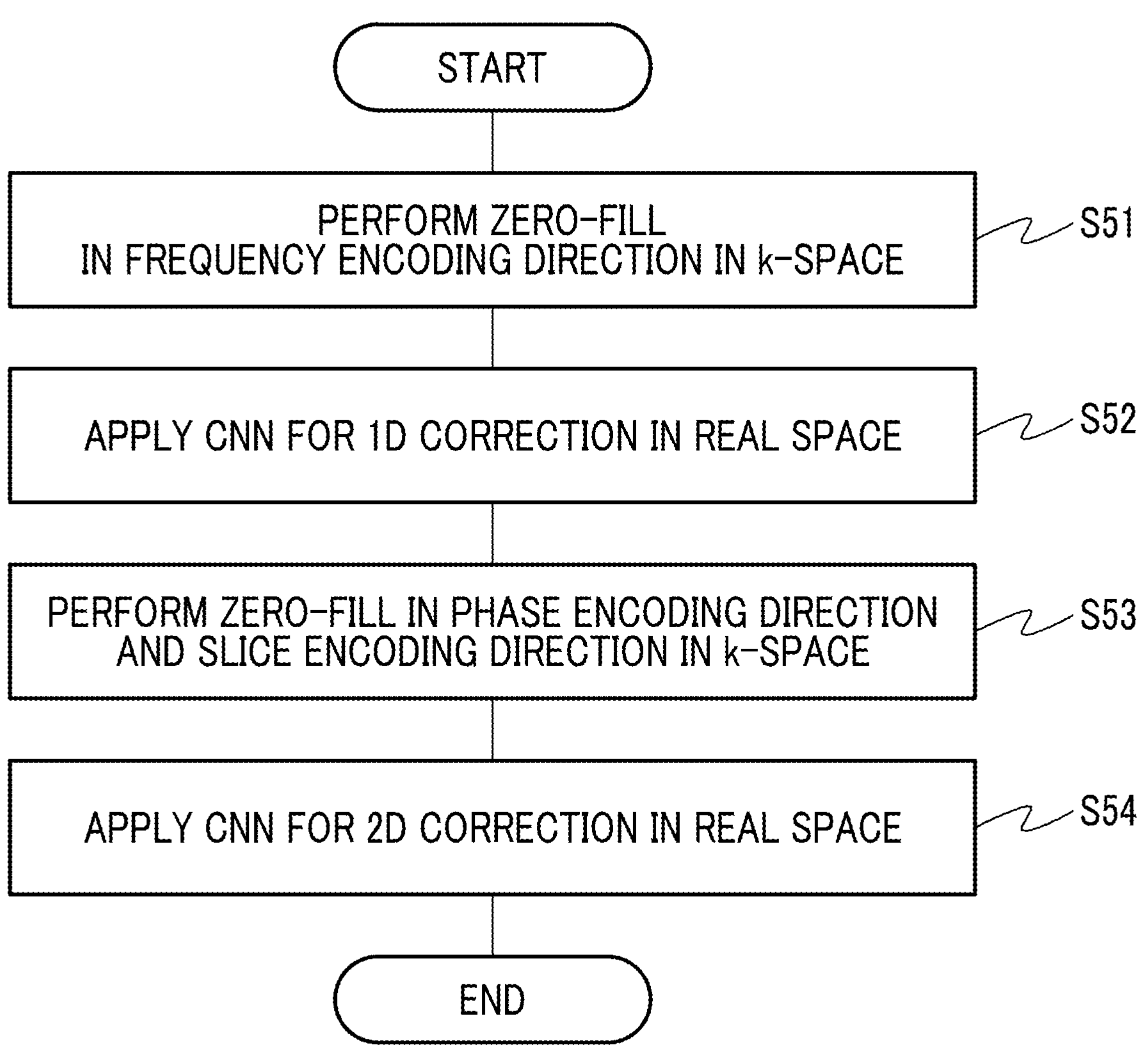
FIG. 11 is a diagram showing another example of the image processing of Embodiment 2.
Figure 12:
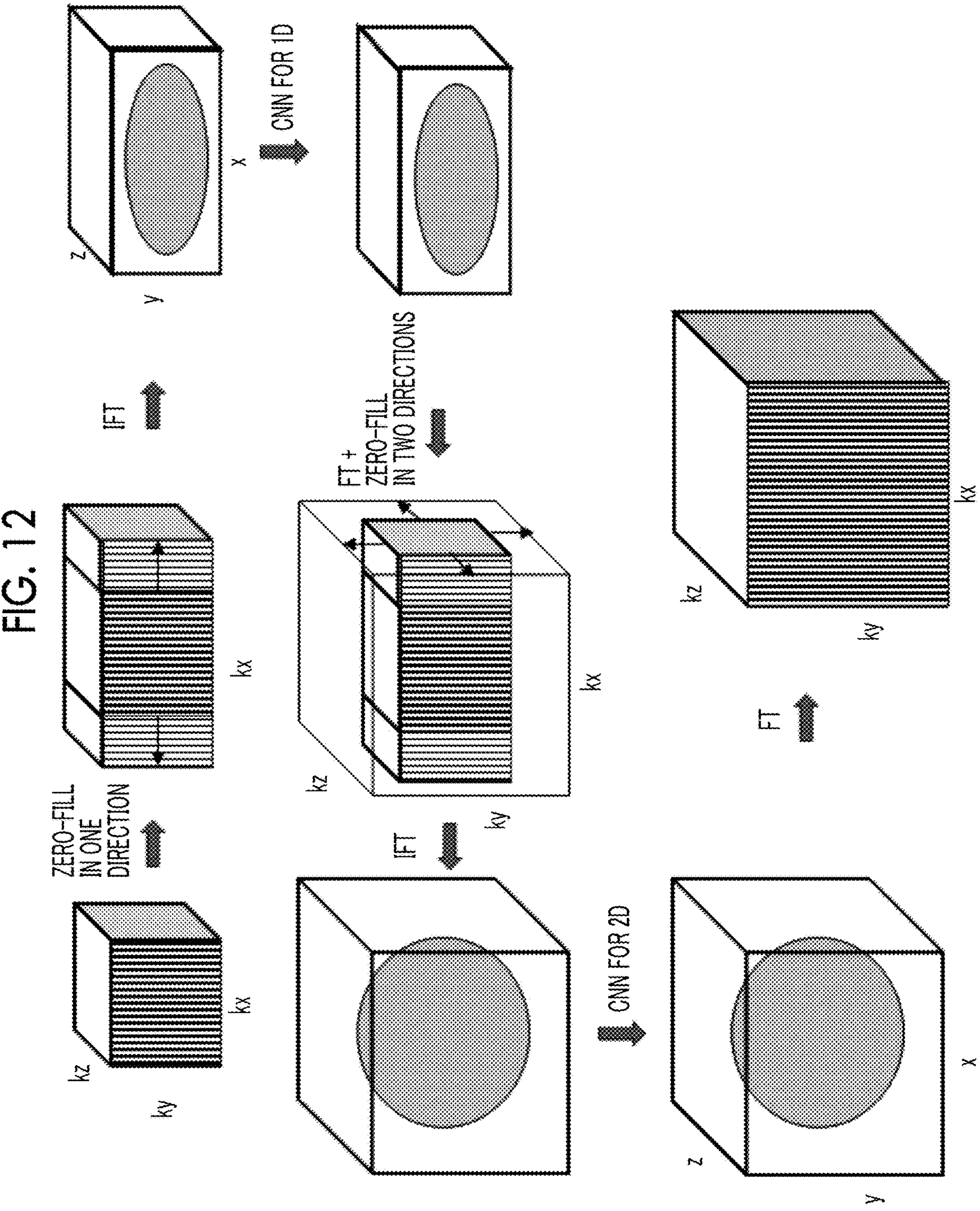
FIG. 12 is a diagram showing the processing of FIG. 11.

In the examples of FIGS. 9 and 10, the CNN for the two-dimensional direction correction is used in the first ringing correction (S42), but as shown in FIGS. 11 and 12, the one-dimensional direction correction may be performed in the first ringing correction (S51, S52), and the two-dimensional direction correction may be performed in the second ringing correction (S53, S54).

According to the present embodiment, by using the CNN for the one-dimensional correction and the CNN for the two-dimensional correction, it is possible to effectively correct the ringing that has occurred in the three-dimensional direction with fewer processing steps than in Embodiment 1 for the three-dimensional image. In addition, since it is not necessary to capture a large number of three-dimensional images during training in the CNN for the two-dimensional correction, the construction of the CNN can be simplified.

Embodiment 3

The present embodiment is similar to Embodiments 1 and 2 in that the CNN having a ringing correction effect for the dimension lower than the dimension of the correction target image is used, but in the present embodiment, a CNN that takes a sampling pattern into consideration is prepared.

Figure 13:
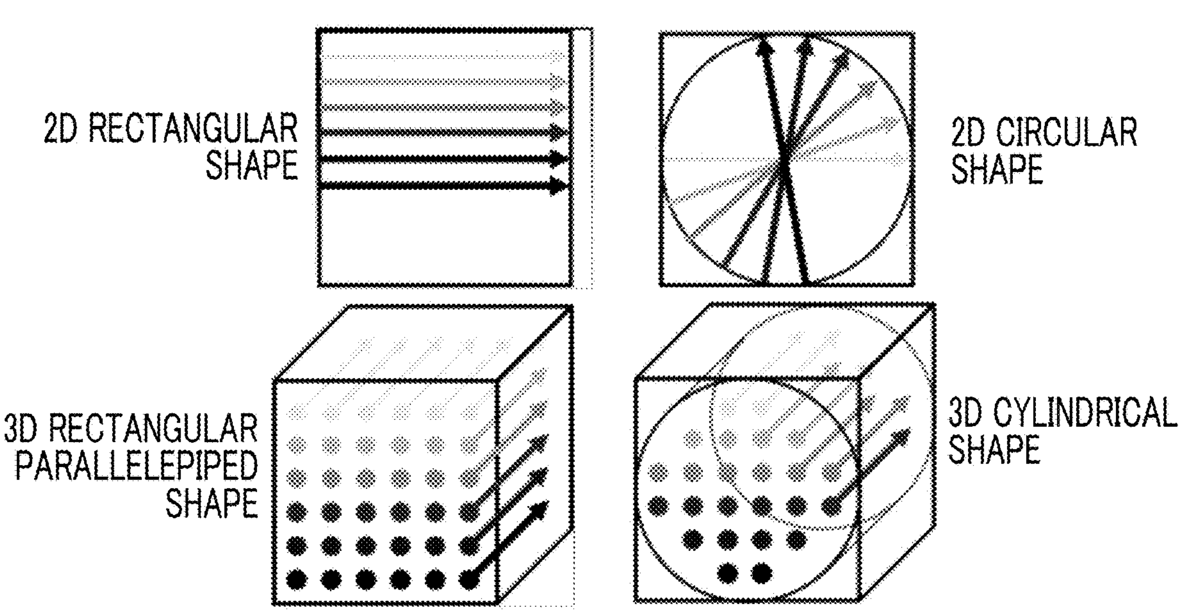
FIG. 13 is a diagram showing a sampling pattern.

The sampling pattern of the measurement data collected by the MRI apparatus differs depending on the pulse sequence. For example, as shown in FIG. 13, in a pulse sequence for raster scanning of a general k-space, a sampling pattern is rectangular in a case of two dimensions or rectangular parallelepiped in a case of three dimensions (hereinafter referred to as a rectangular pattern), but in a pulse sequence typified by radial scanning, the k-space is sampled radially with respect to the center of the k-space, and a sampling pattern is elliptical or cylindrical (hereinafter referred to as an elliptical pattern).

In a case in which the measurement data of the elliptical pattern is reconstructed into the image, the image reconstruction is performed by obtaining the rectangular measurement data through zero-filling or the like, but in a case in which the matrix size is increased in that case, the ringing occurs accordingly. The appearance of the ringing is different from that of the measurement data of the rectangular pattern.

In the present embodiment, the ringing correction unit 234 comprises the CNN 235 for the elliptical pattern in addition to the CNN 235 for the rectangular pattern, making it possible to perform effective ringing correction in accordance with the sampling pattern for the image reconstructed from the measurement data of various sampling patterns.

Figure 14:
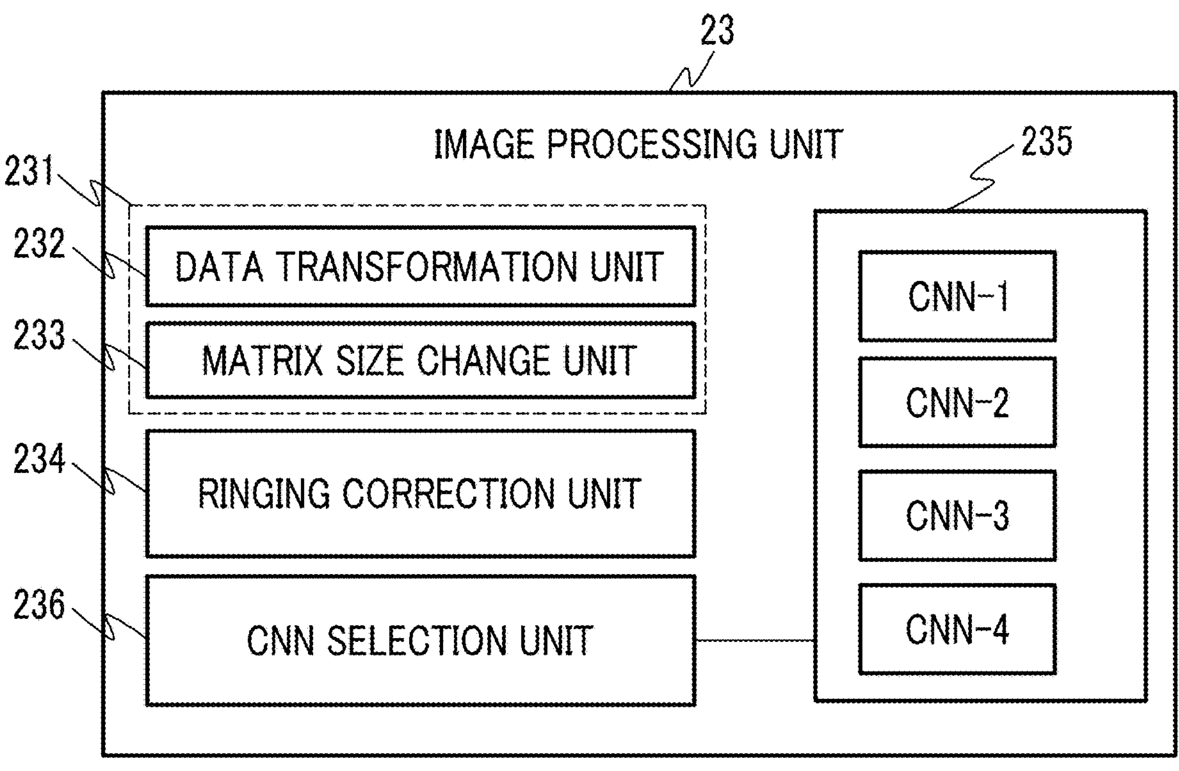
FIG. 14 is a functional block diagram of an image processing unit of Embodiment 3.

The image processing unit 23 according to the present embodiment comprises four types of CNN-1 to CNN-4 as the CNN 235, and as shown in FIG. 14, with respect to the configuration of Embodiment 1 (FIG. 12), a CNN selection unit 236 that selects the CNN in accordance with the sampling pattern is added. Other elements are the same as the elements in FIG. 2, and the description of the functions thereof is omitted.

Figure 15:
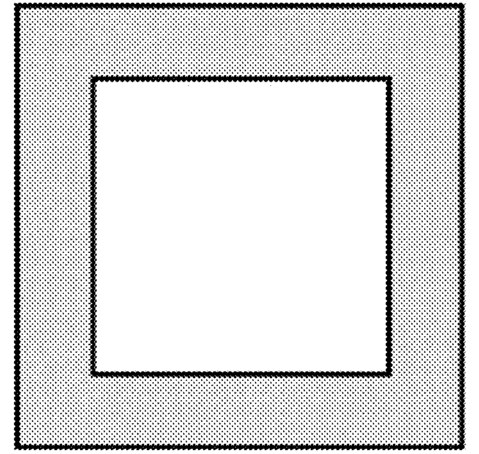
FIG. 15 is a diagram showing a CNN used in Embodiment 3.
Figure 15:
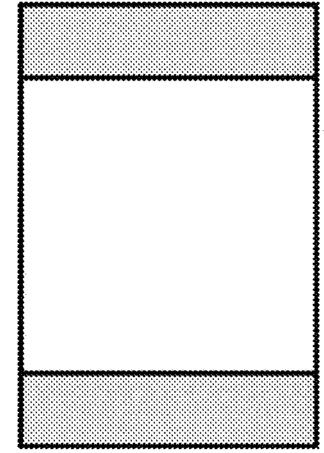
Figure 15:
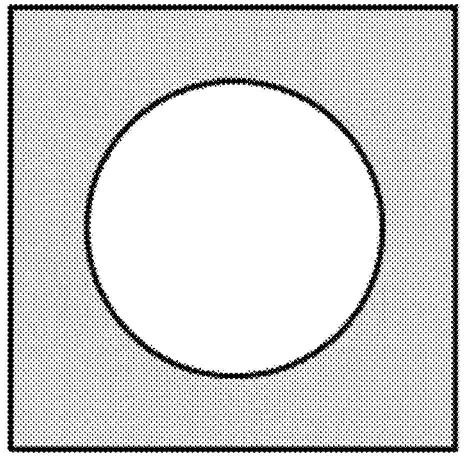
Figure 15:
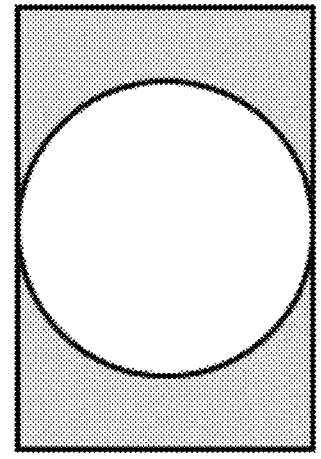

As shown in FIG. 15, the four types of CNNs include two types of CNNs corresponding to the rectangular pattern and two types of CNNs corresponding to the elliptical pattern. Each of the CNN corresponding to the rectangular pattern and the CNN corresponding to the elliptical pattern has a CNN for the two-dimensional direction ringing correction (two-axis extrapolation) and a CNN for the one-dimensional direction ringing correction (one-axis extrapolation). That is, the CNN 235 is composed of a total of four types of CNNs.

The training data used for training each CNN is the same as the training data described in the above-described embodiment, and in a case of the CNN for the one-dimensional direction ringing correction, an image (image 511 in FIG. 5), which is obtained by performing an inverse Fourier transform on the measurement data 501 obtained by the imaging at the measurement matrix size in which the matrix size in at least one direction (for example, ky direction) is larger than the matrix size in the other direction (for example, kx direction), is used as the correct answer image. The input image for training is an image in which the measurement data captured in the elliptical pattern with the matrix size in the other direction (ky direction) as the diameter is subjected to zero-filling in the high-frequency region and has the same matrix size as the correct answer image.

In a case of the CNN for the two-dimensional direction correction, an image obtained by performing an inverse Fourier transform on the measurement data captured at the measurement matrix size that is the same as the final reconstruction matrix size is used as the correct answer image, and an image obtained by being captured with the elliptical sampling pattern having a smaller size than the reconstruction matrix size in the kx direction and ky direction and reconstructed by performing zero-filling of the high-frequency region so as to have a rectangular matrix having the same matrix size as the correct answer image is used as the input image.

A flow of the ringing correction of the image, that is, extrapolation processing of the measurement data in the present embodiment, will be described with reference to FIG. 16.

Figure 16:
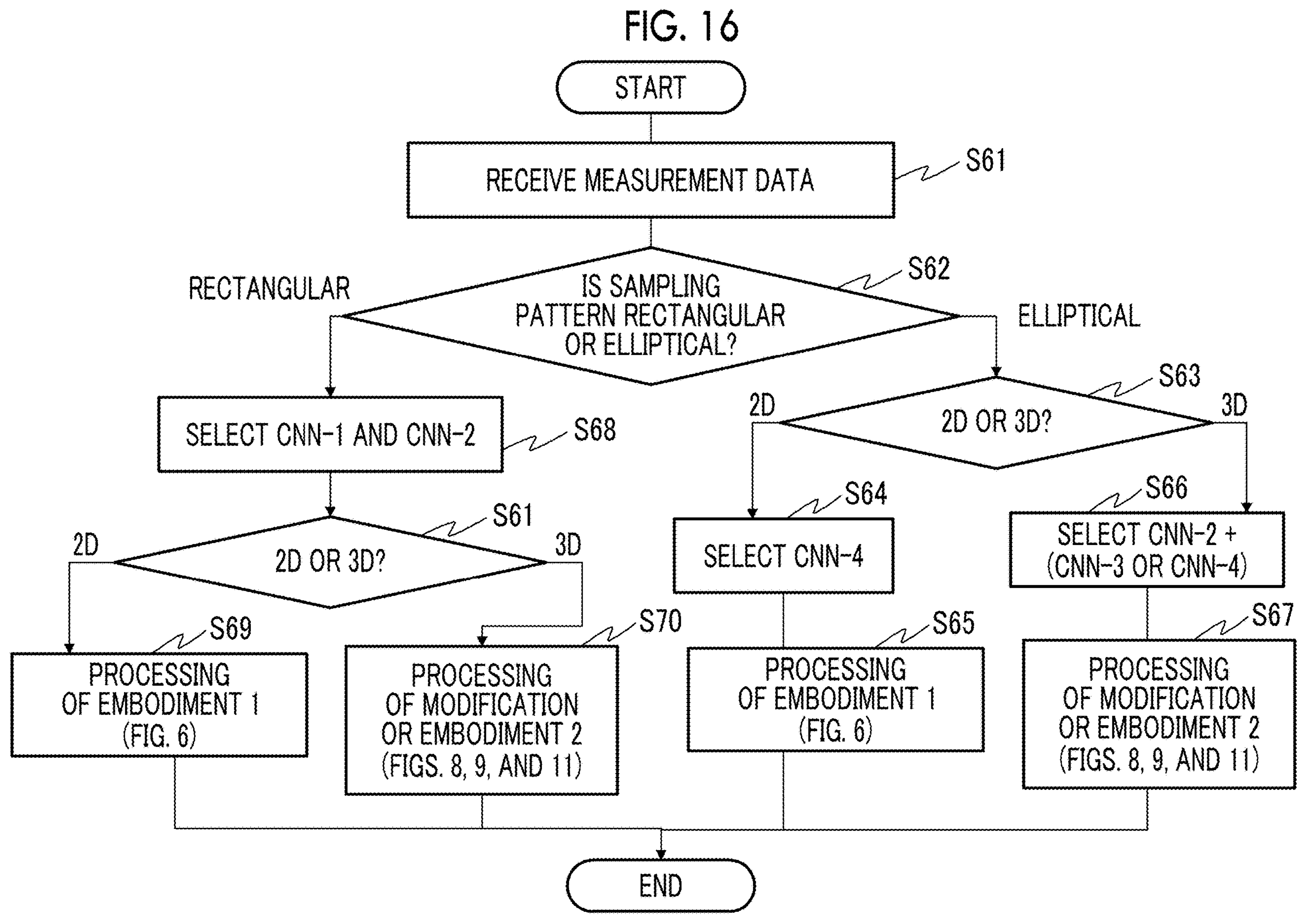
FIG. 16 is a diagram showing a part of processing of Embodiment 3.

Although the ringing correction processing itself in the present embodiment is the same as the ringing correction processing in Embodiments 1 and 2, as shown in FIG. 16, in a case in which the image processing unit 23 receives the measurement data collected by the imaging unit 10 (S61), the CNN selection unit 236 selects the CNN to be used for the processing, based on the sampling pattern and the number of axes of the measurement data (S62).

In a case in which the sampling pattern is the elliptical pattern (S63) and the measurement data is the two-dimensional data, the CNN-4 for the one-dimensional direction correction is selected (S64), and the same processing as performed in Embodiment 1 (FIG. 6) is performed. In a case in which the measurement data is cylindrical three-dimensional data, a combination of some CNNs can be adopted.

Figure 17:
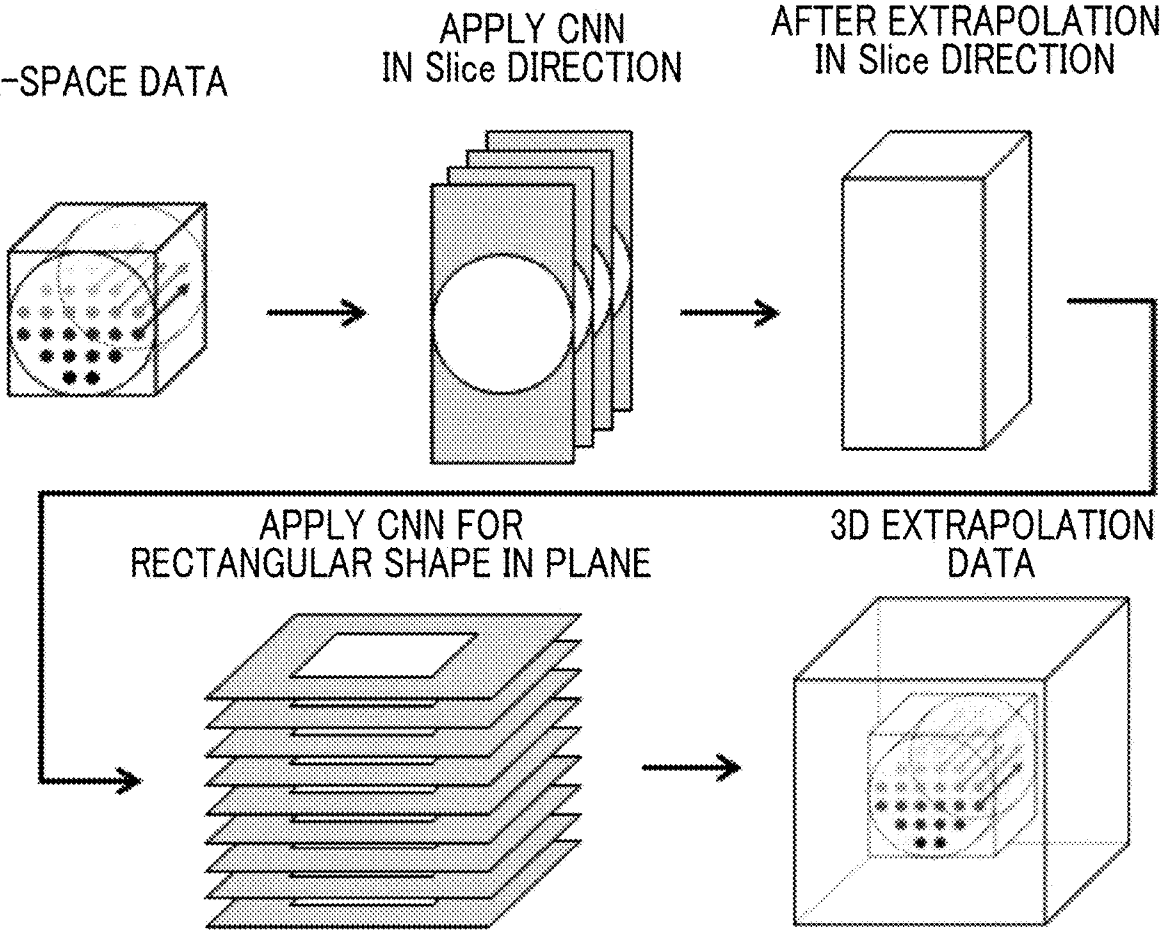
FIG. 17 is a diagram showing an application example of a cylindrical sampling pattern.

For example, as shown in FIG. 17, three-dimensional measurement data of the cylindrical sampling pattern is subjected to zero-filling in the slice direction to obtain the real space data, and the CNN-4 for the one-dimensional correction is applied in the slice direction to extrapolate the slice direction. Next, the measurement data after the extrapolation is subjected to zero-filling in two directions of the frequency encoding direction and the phase encoding direction, and then the CNN-1 for the two-dimensional correction is applied to the xy plane of the real space to extrapolate these two directions. Finally, three-dimensional measurement data in which three directions are extrapolated is obtained. By using this measurement data, it is possible to obtain an image in which the occurrence of ringing is suppressed in any direction.

Alternatively, in the cylindrical pattern, since one direction (for example, the slice encoding direction) has a rectangular pattern, the CNN-2 can be selected for correction for this direction, the CNN-3 for the two-dimensional direction correction or the CNN-4 for the one-dimensional direction correction can be selected for the other two directions, and the ringing correction can be performed using these CNNs by the modification example of Embodiment 1 or any one of two methods of Embodiment 2.

It should be noted that, in a case of the modification example of Embodiment 1, that is, in a case of using the CNN-4 and the CNN-2 for the one-dimensional direction correction in multiple stages (processing of FIG. 8), the ringing correction is performed by using the CNN-2 for a rectangular shape for the direction (slice encoding direction in the example described above) in which the sampling pattern is rectangular. The order in which the CNNs are used is not particularly limited.

In a case in which the sampling pattern is rectangular, the processing is the same as the processing described in Embodiment 1, the modification example of Embodiment 1, and Embodiment 2, the CNN-1 and, as needed, the CNN-2 are selected (S68), and in a case in which the measurement data is two-dimensional data, the one-dimensional direction correction is repeated twice by using the CNN-2 (S69). In addition, in a case of the three-dimensional data, the one-dimensional direction correction is repeated three times using only the CNN-2 (method of the modification example), or the one-dimensional direction correction and the two-dimensional direction correction are performed by using the CNN-2 and the CNN-1 in combination (S70).

It should be noted that, here, a case is described in which the CNN for the one-dimensional direction correction is used for the two-dimensional measurement data, the image processing unit 23 according to the present embodiment comprises the CNNs for one-dimensional direction correction and the two-dimensional direction correction, so that the CNN for the two-dimensional direction correction may be applied to the two-dimensional measurement data, and the ringing correction may be performed in one processing.

According to the present embodiment, it is possible to perform appropriate ringing correction (that is, the extrapolation processing of the high-frequency region) in accordance with the sampling pattern of the measurement data by preparing a plurality of types of CNNs that have been trained corresponding to the sampling pattern.

In particular, by using the CNNs in the one-dimensional direction and the two-dimensional direction for both the rectangular pattern and the elliptical pattern, it is possible to cover most of the measurement data acquired by the MRI apparatus, and it is possible to handle the extrapolation processing of almost all the measurement data without requiring an enormous number of images, including the sampling patterns.

Although the embodiments of the MRI apparatus according to the embodiment of the present invention are described above, the present invention is not limited to these embodiments, and changes in the processing order or changes in the examples of the encoding axis described above are also included in the present invention. In addition, although a case of extrapolating the matrix of the measurement data in the two-dimensional direction or the three-dimensional direction is described as an example, it goes without saying that the present invention can be applied to a case of extrapolating the two-dimensional measurement data only in the one-dimensional direction or the three-dimensional measurement data only in the one-dimensional direction or the two-dimensional direction.

EXPLANATION OF REFERENCES

1: MRI apparatus
10: imaging unit
20: computer
23: image processing unit
231: image generation unit
232: data transformation unit
233: matrix size change unit
234: ringing correction unit
235: CNN
236: CNN selection unit

What is claimed is:

1. A magnetic resonance imaging apparatus comprising:

an imaging unit that collects measurement data consisting of magnetic resonance signals; and one or more processors that has a function of reconstructing the measurement data at a reconstruction matrix size different from a matrix size of the measurement data, and a function of correcting ringing of a reconstructed image, wherein the one or more processors include a CNN that has been trained to obtain a ringing correction effect for a direction of a dimension lower than a dimension of the reconstructed image generated by the image generation unit, and are configured to change the matrix size by performing zero-filling of a high-frequency region in a one-dimensional direction or a two-dimensional direction on the measurement data and apply, in a real space, the CNN in multiple stages to the measurement data after the zero-filling to perform ringing correction.

2. An image processing method of correcting a ringing artifact of a reconstructed image acquired by an MRI apparatus, the image processing method comprising:

a first size change step of performing zero-filling processing of a high-frequency region in a one-dimensional or two-dimensional direction on measurement data of the reconstructed image to generate second measurement data having a larger matrix size than the measurement data;

a first correction step of using a CNN that has been trained to obtain a ringing correction effect for a direction of a dimension lower than a dimension of the reconstructed image to perform, in a real space, ringing correction on the second measurement data for a direction in which the zero-filling processing is performed;

a second size change step of performing zero-filling of a high-frequency region in a direction orthogonal to the direction of the zero-filling processing in the first size change step on the second measurement data corrected in the first correction step to generate third measurement data having a larger matrix size than the second measurement data; and a second correction step of using the CNN to perform, in the real space, ringing correction on the third measurement data for the orthogonal direction.

3. The magnetic resonance imaging apparatus according to claim 1, wherein the CNN has been trained by using, as training data, an image obtained by reconstructing measurement data acquired at a measurement matrix size that is the same as the reconstruction matrix size, and an image obtained by performing zero-filling on measurement data acquired at a measurement matrix size smaller than the reconstruction matrix size for at least one direction and then reconstructing the measurement data.

4. The magnetic resonance imaging apparatus according to claim 1, wherein the CNN has been trained by using, as training data, a first image captured by increasing a measurement matrix size in at least one direction and a second image captured by increasing a measurement matrix size in a different direction from the first image, the first and second images being rotated such that the directions of the increased measurement matrices match each other.

5. The magnetic resonance imaging apparatus according to claim 1, wherein the one or more processors include a first CNN that has been trained to obtain a ringing correction effect for a one-dimensional direction of an image, and performs processing of applying, in the real space, the first CNN to measurement data on which zero-filling of a high-frequency region in a first direction is performed, and processing of applying, in the real space, the first CNN to measurement data obtained by further performing zero-filling of a high-frequency region in a second direction orthogonal to the first direction on the measurement data after the CNN is applied.

6. The magnetic resonance imaging apparatus according to claim 1, wherein the reconstructed image is three-dimensional image data, and the one or more processors include a first CNN that has been trained to obtain a ringing correction effect for a one-dimensional direction of an image, and sequentially executes ringing correction of applying, in the real space, the first CNN to measurement data on which zero-filling of a high-frequency region in a first direction is performed, ringing correction of further performing zero-filling of a high-frequency region in a second direction orthogonal to the first direction on the ringing-corrected measurement data on which the zero-filling of the high-frequency region in the first direction is performed and applying, in the real space, the first CNN, and ringing correction of applying, in the real space, the first CNN to the ringing-corrected measurement data on which the zero-filling of the high-frequency regions in the first and second directions is performed.

7. The magnetic resonance imaging apparatus according to claim 1,
wherein the one or more processors include a first CNN that has been trained to obtain a ringing correction effect for a one-dimensional direction of an image and a second CNN that has been trained to obtain a ringing correction effect for a two-dimensional direction of the image, and perform ringing correction using at least one of the first CNN or the second CNN in multiple stages in accordance with the dimension of the reconstructed image that is a correction target.

8. The magnetic resonance imaging apparatus according to claim 1,
wherein the one or more processors include a plurality of the CNNs for each sampling pattern of the measurement data.

9. The image processing method according to claim 2, further comprising:
a training step of training the CNN,
wherein, in the training step, the CNN is trained by using, as training data, a first image captured by increasing a measurement matrix size in at least one direction.

10. The image processing method according to claim 2, further comprising:
a training step of training the CNN,
wherein, in the training step, the CNN is trained by using, as training data, a first image captured by increasing a measurement matrix size in at least one direction and a second image captured by increasing a measurement matrix size in a different direction from the first image, the first and second images being rotated such that the directions of the increased measurement matrices match each other.

11. The image processing method according to claim 2,
wherein the CNN includes a plurality of types of CNNs in accordance with a sampling pattern or a dimension of the measurement data, and
the image processing method further comprises a step of selecting one or more CNNs from among the plurality of CNNs in accordance with to the sampling pattern or the number of dimensions of the measurement data that is a ringing correction target.

12. The magnetic resonance imaging apparatus according to claim 7,
wherein the reconstructed image is three-dimensional image data, and
the one or more processors execute ringing correction of applying, in real space, the first CNN to measurement data on which zero-filling of a high-frequency region in a first direction is performed, and ringing correction of applying, in the real space, the second CNN to measurement data obtained by further performing zero-filling in a second or third direction orthogonal to the first direction on the measurement data after the ringing correction on which the zero-filling in the first direction is performed.

13. The magnetic resonance imaging apparatus according to claim 7,
wherein the reconstructed image is three-dimensional image data, and
the one or more processors execute ringing correction of applying, in the real space, the second CNN to measurement data on which zero-filling of high-frequency regions in two directions is performed, and ringing correction of applying, in the real space, the first CNN to measurement data obtained by further performing zero-filling in another direction orthogonal to the two directions on the measurement data after the ringing correction on which the zero-filling in the two directions is performed.

14. The magnetic resonance imaging apparatus according to claim 8,
wherein the sampling pattern includes a first sampling pattern having a rectangular or rectangular parallelepiped shape and a second sampling pattern having an elliptical or cylindrical shape, and
the one or more processors include, as the CNNs, a first CNN that has been trained to obtain a ringing correction effect for a one-dimensional direction of an image and a second CNN that has been trained to obtain a ringing correction effect for a two-dimensional direction of the image for each of the first and second sampling patterns.

* * * * *